(12) United States Patent
Saito et al.

(10) Patent No.: US 8,506,919 B2
(45) Date of Patent: Aug. 13, 2013

(54) FINE POWDER OF SINGLE CRYSTALLINE DIAMOND PARTICLES AND A METHOD FOR THE PRODUCTION THEREOF

(75) Inventors: Nobuyuki Saito, Hiratsuka (JP); Hisao Shirasawa, Oyama (JP); Hiroshi Yamanaka, Oyama (JP); Hiroshi Ishizuka, Tokyo (JP)

(73) Assignee: Hiroshi Ishizuka, Tokyo (JP)

( * ) Notice: Subject to any disclaimer, the term of this patent is extended or adjusted under 35 U.S.C. 154(b) by 0 days.

(21) Appl. No.: 11/813,738

(22) PCT Filed: Jan. 1, 2006

(86) PCT No.: PCT/JP2006/300563
§ 371 (c)(1),
(2), (4) Date: Nov. 11, 2008

(87) PCT Pub. No.: WO2006/075763
PCT Pub. Date: Jul. 20, 2006

(65) Prior Publication Data
US 2009/0175776 A1    Jul. 9, 2009

(30) Foreign Application Priority Data

Jan. 11, 2005 (JP) ................................. 2005-004568

(51) Int. Cl.
*B01J 3/06* (2006.01)
*A01K 43/04* (2006.01)
*C22B 11/10* (2006.01)
*B03B 11/00* (2006.01)

(52) U.S. Cl.
USPC ............. 423/446; 209/511; 209/60; 209/494; 977/895; 977/775

(58) Field of Classification Search
None
See application file for complete search history.

(56) References Cited

U.S. PATENT DOCUMENTS

| | | | | |
|---|---|---|---|---|
| 4,758,334 | A | * | 7/1988 | Rodgers ..................... 209/441 |
| 5,143,224 | A | * | 9/1992 | Burchell ..................... 209/579 |
| 7,564,023 | B2 | * | 7/2009 | Blagden ..................... 250/222.2 |

FOREIGN PATENT DOCUMENTS

| | | |
|---|---|---|
| JP | 2002 35636 | 2/2002 |
| JP | 2004 339412 | 12/2004 |
| WO | WO 02/08122 | 1/2002 |

OTHER PUBLICATIONS

Zhu et al.; Dispersion of Nanodiamond and Ultra-Fine Polishing of Quartz Wafer; China Particuology; vol. 2, No. 4, pp. 153-156; 2004.*

*Primary Examiner* — Guinever Gregorio
(74) *Attorney, Agent, or Firm* — Stites & Harbison PLLC; Nicolo Davidson; Richard S. Myers, Jr.

(57) ABSTRACT

An object of this invention is to provide a fine powder of diamond particles of less than 50 nm with a narrow particle size range. The diamond is single crystalline and characterized with a lot of sharp edges and sharp points. Another object is to provide a method for efficiently producing such fine powder.

The method comprises mechanically crushing a raw material of single crystalline diamond particles to prepare starting minute particles of diamond, then imparting hydrophilic quality to the surface of diamond particles. As hydrophilic the diamond particles are dispersed in water to form a slurry, which is set and kept weakly alkaline. The slurry is then subjected to a preliminary grading step, whereby the slurry is removed of a top particle size fraction of the diamond particles that has a $D_{50}$ size of 60 nm or more. Eliminated of said top particle size fraction, the slurry is then diluted with water to regulate the diamond concentration to 0.1% (by weight) or less. The slurry so conditioned is subjected to a centrifugal force, whereby a coarser particle size fraction of the diamond particles is condensed to a solid cake and removed from the slurry. Effluent slurry is taken out from the centrifugal grading that contains a fraction of the diamond particles having decreased particle sizes.

4 Claims, 2 Drawing Sheets

FINE POWDER OF SINGLE CRYSTALLINE DIAMOND PARTICLES AND A METHOD FOR THE PRODUCTION THEREOF

FIELD OF INVENTION

This invention is related to a powder consisting of finely divided single crystalline diamond particles and, in particular, an abrasive powder that is especially adapted to the use in high-precision machining processes. The invention is also related to a method for the production of such powder.

TECHNICAL BACKGROUND

With the progress in high precision machining technology, demands for diamond abrasives have been shifting to increasingly smaller particle sizes, to an extent that, in some cases, a surface roughness of 1 Å is required. The smallest diamond particles ever produced for abrasive applications are of "detonation" type, consisting of a mass of secondary particles that is an agglomeration of smaller, primary particles, which average 5 to 10 nm. It has been observed that this type of diamond, synthesized in a process where an explosive is combusted incompletely, has a lot of defects within the crystal and shows, when observed by transmission electron microscopy (TEM), rather round appearance commonly, as a result of the growth duration too short, being on the order of one-digit microseconds.

Individual diamond particles as yielded in a detonation technique are, as described above, very small and thus have a very active surface. They agglomerate readily to form secondary particles, firmly joined by means of non-diamond carbon or other substances that come in from the synthesis process and atmosphere. So this type of diamond behaves apparently as agglomerated particles with a size of 100 nm or more. It is also known that such secondary particles can be disintegrated into primary particles in a rigorous acid treatment.

Among the products of a technology based upon the extreme compression powered by chemical explosion or detonation, commonly known is the DuPont polycrystalline type diamond, which is produced by conversion from graphite under extremely high pressure by means of energy of chemical explosion. This type of diamond also is in a secondary particle structure: such that primary particles, commonly having a size of 20 to 30 nm, are fused in part and joined to each other under the extreme compression in excess of 30 GPa during the conversion process, trapping some graphite left unused. Consisting of firmly joined secondary particles of 100 nm or more, DuPont diamond also behaves as such; however this type, in contrast, cannot be disintegrated even by rigorous acid treatment. TEM microscopy shows that the primary particles do not exhibit idiomorphic faces but a somewhat spheroidal overall appearance, which is considered as an evidence of the limited conversion period.

Either of the above described processes is not adequate for the production of idiomorphic crystals, since they depend, for the compression of the starting material of low pressure phase of carbon, upon a chemical detonation, which, if extremely high in magnitude, lasts only for one-digit microseconds, a duration too short for the product to grow into such desired abrasive particles with sharp edges and points. So when used as an abrasive, the diamond products, which have few sharp edges or points, of the both techniques are short of achieving an efficient grinding rate, although the abrasive grits leave fine polishing marks in accordance with such small size of the primary particles.

On the other hand, static compression techniques can control properties such as shape, hardness and brittleness of the diamond product by operating at properly chosen pressure, temperature and time parameters to be applied. Further so produced diamond crystals can be readily crushed into very fine particles by impact-milling with steel balls.

It is observed under TEM microscopy that most of such fine particles, which have a size of tens of nanometers, are idiomorphic and have sharp edges, as a result of the crushing process that mostly takes place on the basis of the cleavage of diamond crystals. In some instances there are even flat triangular fragments of crystal observed with about 5 nm sides.

The Inventors have found that very fine powder or mass of very minute single crystalline diamond particles can be produced in a properly combined process of micro-crushing and precision grading. Based upon this finding we developed a technology for the production of 100 to 50 nm $D_{50}$ diamond powder, for which we filed a patent application (published under Japan Kokai 2002-035636).

In the invention processed are particles of single crystalline diamond size-reduced by impact-crushing described above. The particles so crushed have commonly sharp edges and points to an extent that they often include some particles with a flat, regular triangular shape, as a result of well-known cleavage on (111) faces.

For crushing of the invention there are available such techniques as a handy process of ball mill with steel balls, while vibration mill and planetary mill can load more powerful impacts. A preferable crushing medium is steel balls for they have a sufficiently high density. Coarse diamond particles may also be used for the purpose of minimizing the contamination originating from the medium material.

Diamond particles as taken out from the crushing mill are first treated with chemical, in order to remove by dissolving debris of crushing medium having mixed during the process. The diamond particles then are subjected to a combined grading process of elutriation and centrifugation. In both processes the diamond particles are held in suspension and processed in the water, it is needed that the particles have affinity for water on the surface, in order to maintain stable suspension.

For this purpose a surface oxidization treatment is effective, whereby diamond particles are oxidized to attach on the surface such hydrophilic atom as oxygen or oxygen-containing group, as hydroxyl, carbonyl, and carboxyl, for example. For the surface oxidization, while heating to 300° C. or more in air may be available with a certain effect, a more reliable process may consist of a wet process, whereby diamond is treated in a bath comprising both one selected from sulfuric acid, nitric acid, perchloric acid, and hydrogen peroxide, and one selected from potassium permanganate, potassium nitrate and chrome oxide.

For preparing a good suspension of diamond particles in water it is necessary to minimize the overall concentration of ions that coexist in the water and, at the same time, to regulate the surface potential within the range adequate for establishing a good suspension. It is known that in weak alkaline condition diamond particles hold in suspension by repulsion each other of charges on the particle surfaces, so it is necessary to regulate the hydrogen-ion concentration and the zeta potential within the proper ranges, which are between pH 7.0 and 10.0 and between −40 and −60 mV, respectively.

While the elutriation technique is widely employed for the size grading of small diamond particles, it has a difficulty in that they need an extremely long precipitation time with such 100 nm or less diamond particles, resulting in a poor productivity. A combined process with super high speed centrifuge may somewhat increase the productivity; this approach is not necessarily realistic, because such equipment itself can be expensive, while there will be some problems in both maintenance and securing safety.

DISCLOSURE OF INVENTION

Problem to be Solved by the Invention

Therefore, one of the principal objects of this invention is to provide an efficient method for the particle-size grading to produce finely divided diamond particles having a $D_{50}$ size less than 50 nm. Another object is to provide a fine abrasive powder of diamond particles that have cleavage-based sharp edges, specific to diamond crystal, as well as a close range of particle size distribution, and thus can meet the high criteria for the precision and efficiency demanded in the precision machining industry.

The present inventors have by now found that such problems as described above can be solved, and a fine powder composed of such minute diamond particles and having a $D_{50}$ particle size less than 50 nm and a close particle size range can be efficiently separated and recovered, by introducing to the size grading (classification) process a common centrifugal machine that is commercially available on market, and by optimizing the operation parameters of the process.

Means for Solving the Problem

The method of this invention for the production of a fine powder of single crystalline diamond particles, comprises:
(1) a step of crushing, by an impact loading mechanical breaking means, a raw material of single crystalline diamond particles that is a product of a conversion from non-diamond carbon under static ultrahigh pressure, to prepare starting minute diamond particles,
(2) a step of oxidizing surfaces of said starting minute diamond particles to chemically attach hydrophilic atoms or functional groups to the surfaces of diamond particles and thus to impart thereto hydrophilic quality,
(3) a step of preparing a slurry by dispersing the hydrophilic diamond particles in a water medium, wherein said slurry is set and kept weakly alkaline (by addition of an alkaline substance thereto),
(4) a step of subjecting said slurry to a wet-mode preliminary particle size grading process, in order to remove by sedimentation from said slurry a top particle size fraction of the diamond particles, said top particle size fraction having a $D_{50}$ size of 60 nm or more,
(5) a step of adding de-ionized water to a remainder of said slurry, which has been removed of said top particle size fraction, to a diamond concentration of 0.1% by weight or less,
(6) a step of subjecting said remainder of the slurry to a centrifugal grading process, whereby a coarser particle size fraction of the diamond particles contained in said slurry is condensed and removed from the slurry, while said water medium is taken out of the centrifugal grading process as an effluent slurry that contains a fraction of diamond particles of an average particle size that has been decreased due to the removal of coarser diamond particles,
(7) a step of repeating once or more an operation of the step (6) above, whereby a coarser particle size fraction of the diamond particles is separated by condensation and removed as a solid mass from the slurry, until a target set of parameters have been achieved with the diamond particles contained in said mass: a $D_{50}$ size of 50 nm or less and ratios of $D_{10}$ size to $D_{50}$ size and $D_{90}$ size to $D_{50}$ size of 50% or more and 200% or less, respectively, said slurry effluent from the centrifugal process containing a fraction of diamond particles having a smaller average particle size; and
(8) a step of recovering from said slurry the diamond particles as having a minimal average particle size by precipitating into a solid mass.

By subjecting mechanically crushed single crystalline diamond particles to the particle size grading process of the invention described above, a fraction of diamond particles can be recovered from the final effluent slurry that has a $D_{50}$ average size as small as 50 nm or less and, at the same time, a close ranging size distribution such that the ratios of $D_{10}$ size to $D_{50}$ size and $D_{90}$ size to $D_{50}$ size are 50% or more and not exceeding 200%, respectively, as evaluated with a Microtrac UPA particle size analyzer.

The hydrophilic atom or group to be used for and in the method of this invention comprises one or more selected from hydroxyl group, carbonyl group and carboxyl group.

In the method of the invention at step 3, dispersion of diamond particles in the slurry can be promoted by addition of an alkaline substance to set and keep the slurry weakly alkaline. So it is preferable in this context that the hydrogen ion concentration in the slurry be set and kept between pH 7.0 and 10.0 at steps 3 and later.

Also, at step 3 the zeta (ζ) potential in the slurry may preferably be controlled within a range of −40 to −60 mV.

Further in the method of the invention at step 6, a coarser particle size fraction of diamond particles can be condensed and taken out from the centrifugation process. The diamond particles, recovered as a cake, then can be dispersed again in de-ionized water to form further slurry and can subsequently be subjected to a centrifugal grading process as in step 6. From this process, an effluent slurry can be recovered from the centrifugal process that contains a fraction of diamond particles having a further decreased average particle size.

Effects of Invention

In accordance with the method of this invention, it is possible to produce single crystalline diamond particles that have, in spite of the extremely minute particles with a $D_{50}$ average size of 50 nm or less, cleavage-based sharp edges and sharp points, in contrast to the conventional and commercially available diamond abrasives of corresponding minute particle sizes.

Minute diamond particles can be recovered at high yields with minimum loss: while minute diamond particles may be trapped to a degree in a cake of condensed coarser diamond particles, they can be released back into the water medium when the cake is dispersed again in de-ionized water for re-use as slurry to be processed on a centrifugal machine at step 6, and the water medium is also taken out as effluent slurry as containing diamond particles with a further decreased particle size.

BEST EMBODIMENT OF WORKING OUT THE INVENTION

Figure 1:
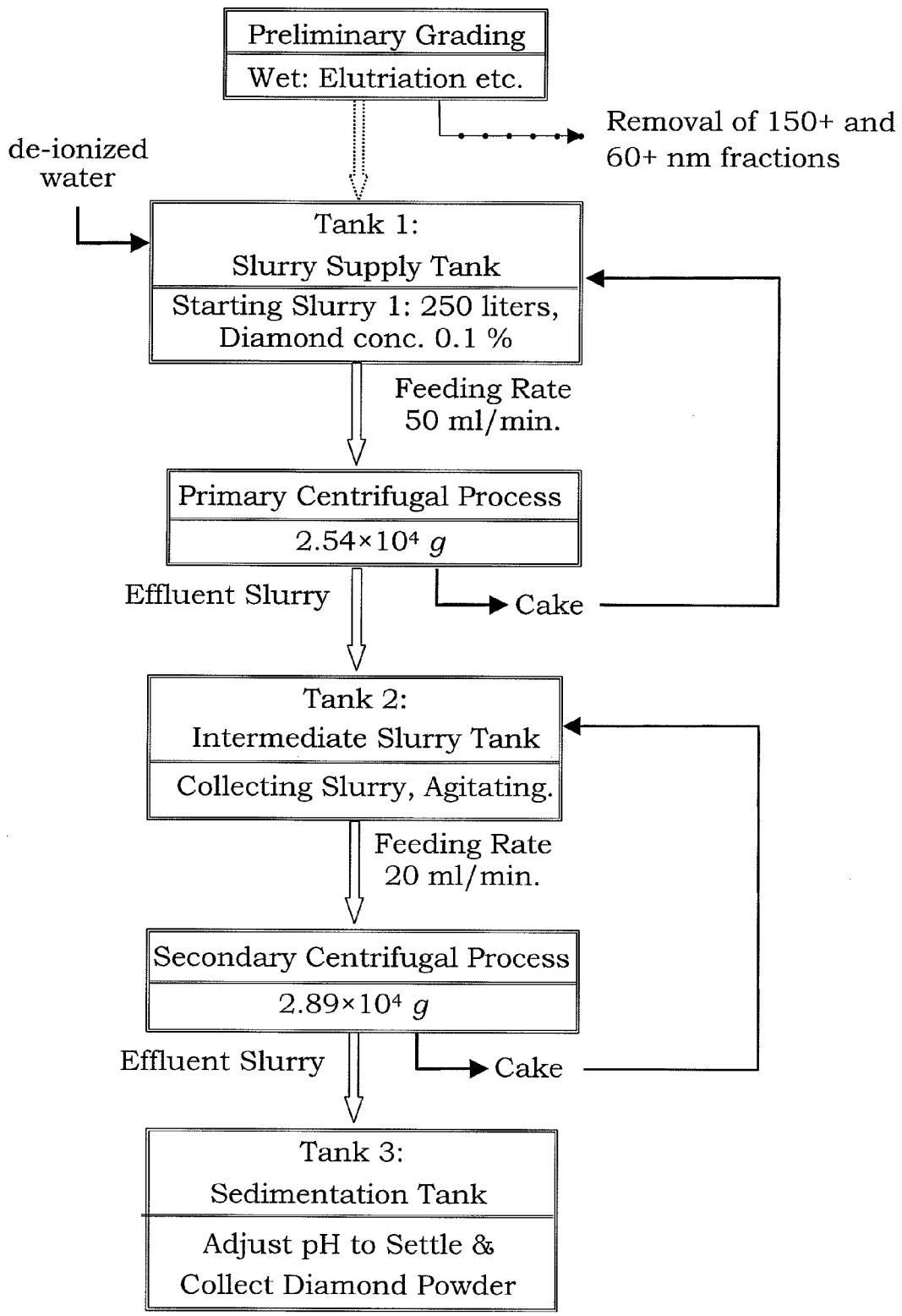
FIG. 1 shows schematically a flow diagram for an exemplar precision particle-size grading process following the method of the invention, wherein the slurry is processed with two centrifugal machines connected in series (Example 1, to be given)

In an embodiment of the method of the invention, a precision particle-size grading system is used that comprises two slurry storage tanks connected to a single centrifuge, or centrifugal machine. Fine diamond particles to be graded are held in suspension in water or as slurry, which is stored in a first tank, and fed to the centrifugal machine to be subjected to a centrifugal force, so that a coarser particle size fraction of the diamond particles in the slurry is condensed, separated and removed as a cake from the slurry, which leaves the centrifugal machine.

The slurry, which has been eliminated of the coarser diamond particles and thus contains the finer particle size fraction at an increased proportion accordingly, is flown out of the centrifugal machine and received and collected in the second storage tank.

In the centrifugal grading process, grading efficiency can be increased by (1) regulating the diamond concentration of slurry well below a specific level by occasionally diluting the slurry with de-ionized water and, at the same time, (2) stabilizing the conditions of diamond particles dispersed in the slurry, by regulation of hydrogen ion concentration of the slurry and thus securing a zeta ($\zeta$) potential maintained within a proper range.

For the use in the grading process it is desired that centrifugal machines have a capacity to generate a centrifugal acceleration of at least $2 \times 10^4$ g, which may vary to a degree depending upon the target quality in particle size of diamond powder to be collected. Effluent slurry is passed to another centrifugal process after conditioned as described below.

The slurry to be fed to the centrifugal machine preferably should have a concentration of diamond as low as possible, so that the diamond particles can behave effectively as individual particles, although favorable concentrations can vary depending upon the particle size to be recovered. On the other hand, however, higher concentrations of diamond particles in the slurry are desired in order to secure a good productivity level with the centrifugal grading process.

Considering the both aspects, the proper concentration is, it can be said, 0.1 (mass) % or less for the collection of a fraction of diamond particles having a 40 nm $D_{50}$ average size and 0.05% or less but not anyway less than 0.01% for a fraction having a 20 nm $D_{50}$ average size.

This invention intends to a precise grading of minute particles of diamond, which, as particles of size less than 50 nm, have very active surfaces and thus tend to aggregate and readily form secondary particles. Thus it is essential to a successful grading process that the diamond particles are well dispersed in the slurry in the state of primary particles. For this purpose it is effective, as described above, to use a slurry containing as low a concentration of diamond particles as possible, in order to maintain a low frequency of collision of diamond particles that lead to their aggregation.

In the invention the centrifugal grading process can be realized based on and by using a common centrifugal machine available on market, with a low centrifugal performance of at least $1 \times 10^4$ g acceleration, for example, though several cycles of the centrifugal grading process may be carried out, in order to secure a higher grading performance. In this case the diamond particles condensed and collected as a cake in the centrifugal machine is dispersed again in de-ionized water medium to form further slurry, and then fed to the same or another machine for a further centrifugal grading.

In the precision grading process of the invention, which involves several cycles of collecting diamond particles as a cake and dispersing them in water medium, coarser agglomerated, or secondary, particles can increasingly break down over those cycles into constituent smaller particles of varying sizes, among which larger particles can preferentially be condensed to a cake, while smaller particles preferentially remain in the slurry.

The apparent particle size of the diamond particles contained in a cake can vary from cycle to cycle, as aggregated particles increasingly break down into constituent particles of various sizes. More commonly cakes from a second grading process tends to have an apparent $D_{50}$ size increased over the previous cycle.

Figure 2:
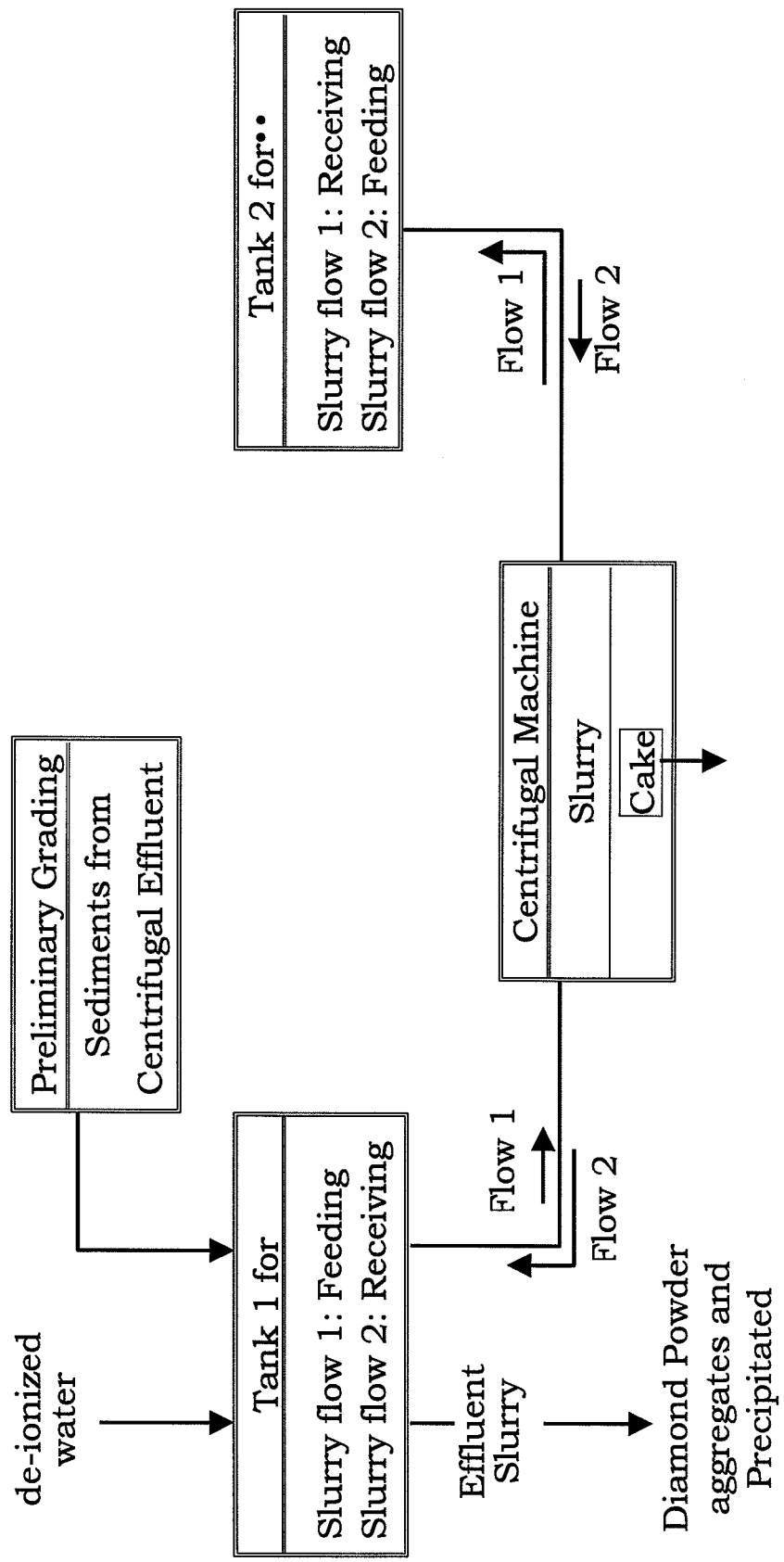
FIG. 2 shows schematically a flow diagram illustrating another exemplar precision particle-size grading process following the method of the invention, wherein the slurry is processed in a two-way flow on a single centrifugal machine (Example 2, to be given)

In the method of this invention, it is possible and effective for the production of diamond particles of average particle size of 30 nm or less, to operate the grading process with an arrangement comprising two slurry tanks, tank 1 and tank 2, which are connected on the inlet (influent) side and outlet (effluent) side of the said centrifugal machine, as diagrammatically shown in FIG. 2. Thereby, a reciprocal cycle or cycles of the centrifugal grading process is made possible to be done in a manner that the slurry is made to flow in two reciprocal by traversed stream directions from the first tank to the second tank via the centrifugal machine and next from said second tank to the first one tank via the centrifugal machine.

In the invention it is effective for the collection of diamond of average particle size under 30 nm to arrange two slurry tanks: tank 1 and tank 2, in connection on the inlet (influent) and outlet (effluent) sides of a centrifugal machine, as shown schematically in the flow diagram in FIG. 1. Slurry can be flown in two directions by switching, either from tank 1 to tank 2 or reversely. Here slurry is fed from one tank at the inlet, subjected to a centrifugal process, removed of a coarser fraction of diamond particles, and received as effluent slurry in the other tank at the outlet, which is held in suspension by fully agitating. In a subsequent centrifugal process, the direction of slurry flow is reversed: starting slurry is fed from slurry tank 2 to the centrifugal machine and the effluent slurry is received in slurry tank 1.

Several repeated processes of centrifugation substantially increase the time over which the slurry stays in the centrifugal machine. A similar effect can be achieved by decreasing significantly the feeding rate of slurry to the centrifugal machine.

Slurry to be fed to the centrifugal machine is prepared by disintegrating agglomerated particles into individual constituent (primary) crystals, removal of smaller particles attached to larger particles, and holding such minute diamond particles in apparently stable suspension. Such disintegration and smaller particle removal can be effectively conducted by irradiation of ultrasonic waves. Surfactant may be used, when necessary, for stabilizing and maintaining the dispersion of the slurry.

In the grading system of the invention as constructed above, such fine diamond powder with a $D_{50}$ size under 50 nm and, in an optimized condition, under 20 nm can be recovered from a process with a centrifugal machine available on market for common purposes. Stable dispersion of diamond particles in the slurry is essential to achieving a powder of close particle size range, and can be realized by properly regulating the hydrogen ion exponent and zeta potential. Thus it is possible, for example, at a pH of 7.0 to 10.0 and a zeta potential of −40 to −60 mV, to achieve ratios of $D_{10}$ and $D_{90}$ to $D_{50}$ average value of or over 50% and not exceeding 200%, respectively, and in a better conditioned process, of or over 60% and not exceeding 190%.

Example 1

A diamond powder of class zero, which had a nominal particle size of less than one micrometer, synthetic single crystalline diamond particles was used as a raw material for the precision grading of the invention. The diamond powder was a product of a synthetic process whereby non-diamond carbon had been converted on a hydraulic press, which had been significantly size reduced by crushing process in a mill with steel balls. The diamond powder also had passed a rough size-grading, in order to obtain raw diamond powder ready for the particle size grading process in accordance with the invention.

The raw diamond powder particles were first oxidized by heating in a bath of mixture of concentrated sulfuric acid and concentrated nitric acid, at a temperature between 250° and 300° C. for more than 2 hours, so that hydrophilicity was imparted to the diamond particle surfaces. The resulting hydrophilicity was observed by IR spectroscopic analysis, which indicated absorption by such oxygen-containing hydrophilic functional groups as carboxyl, carbonyl and hydroxyl groups. The diamond particles were then washed fully to eliminate the residual acid and, further, dispersed in de-ionized water to form slurry. Ammonia water was added to the slurry to adjust the pH at 8.2. The slurry in this condition was observed to have a zeta-potential of about −55 mV.

The slurry was passed to an elutriation grading system, where a fraction of coarser diamond particles, which had a $D_{50}$ size of 150 nm or over, was removed from the slurry. The remaining slurry, that is as eliminated of such coarser particle fraction, was then passed into a centrifugal machine for a preliminary grading, whereby another fraction having a $D_{50}$ size over 60 nm was condensed into cake by the centrifugation and separated from the slurry. The slurry as further eliminated of this fraction was taken out of the centrifugal machine, then passed into and stored as raw slurry ready for the precision grading in a raw slurry reservoir of 5 $m^3$ capacity.

Said raw slurry was then subjected to the precision grading process with a centrifugal machine, as diagrammatically shown in FIG. 1, in order to recover a fraction of diamond particles having a $D_{50}$ size less than 50 nm. Here two centrifugal machines were arranged in connection with each other on a continuous single channel for the flow of slurry, and an intermediate slurry tank (tank 2) was provided between the two centrifugal machines, while two slurry tanks (tanks 1 and 3) were provided outward at the upstream and downstream ends of the channel, respectively, as supply tank for the preparation and temporary storage of slurry to be fed to the centrifugal machine and as slurry sedimentation tank for receiving the effluent slurry and eventually recovering diamond particles by sedimentation.

In the centrifugal precision grading process, two centrifugal machines are arranged on and in connection via a single continuous channel as a passage for the slurry containing diamond particles to be graded. The machines were referred as primary (upstream) and secondary (downstream) in relation to the direction of slurry flow. An agitator was equipped on the slurry supply tank and intermediate tank, so that the slurry held therein were steadily stirred and diamond particles were fully in suspension in the water.

For the process, two high-speed centrifugal machines (both of Model H2000 product of Kokusan Co., Japan) were used, which had a 200 mm diameter rotor for collecting the cake of condensed particles and could generate a centrifugal acceleration of $2.89 \times 10^4$ g at a rotation of 16,000 r.p.m. The three slurry tanks each had a capacity of 0.5 $m^3$.

In preparations for the centrifugal grading process, the raw slurry containing the diamond particles, as eliminated in advance of top, or oversize, fractions of diamond particles by the elutriation and preliminary centrifugal grading, was transferred from the raw slurry reservoir (not shown) to the slurry supply tank (tank 1). The raw slurry was added with de-ionized water to prepare 250 liters of starting slurry containing about 0.1% (by mass) of diamond particles to be fed to the centrifugal machine for further grading.

In the precision centrifugal grading system, the primary centrifugal machine, or first-step centrifuge, was operated at a rotation speed of 15,000 r.p.m. (generating an acceleration of $2.54 \times 10^4$ g), to which the slurry containing about 0.1% (mass) of diamond particles was fed at a rate of 50 ml/min.

The effluent slurry from the centrifugal machine was received and collected in the intermediate tank and, after fully stirred, was fed for a further grading at a rate of 20 ml/min. to the secondary centrifugal machine, which was driven at 16,000 r.p.m. (producing an acceleration of $2.89 \times 10^4$ g). The effluent slurry from the outlet of this centrifugal machine was passed to and collected in the sedimentation tank.

The fraction of diamond particles that was condensed and removed as cake from the primary centrifugal machine was placed in the slurry supply tank (tank 1), and added with de-ionized water to form 250 liters of slurry, and likewise fed again to said primary centrifugal machine at a rate of 50 ml/min.; which was driven at 15,000 r.p.m., generating an acceleration of $2.54 \times 10^4$ g.

In the operations described above, the effluent slurry from the second cycle of grading process with the primary centrifugal machine was collected in the intermediate slurry tank (tank 2), to which added the cake of diamond particles condensed and separated from the slurry in the previous cycle of process with the secondary centrifugal machine. The slurry thus formed is then fed to the secondary centrifugal machine at a rate of 20 ml/min. to the centrifugal machine in operation at 16,000 r.p.m. generating a $2.89 \times 10^4$ g acceleration. The effluent slurry from this cycle of grading process with the secondary centrifugal machine was received and collected in the sedimentation tank (tank 3). Hydrochloric acid was added to the collected slurry to adjust the hydrogen ion index to a pH of 2, thus causing aggregation and sedimentation of the diamond particles from the slurry for recovery.

In the primary and secondary centrifugal grading processes described above, the cakes of diamond particles recovered from each centrifugal machine, as well as the sediments recovered from the sedimentation tank were separately dried at 130° C., weighed and evaluated in terms of their particle size distribution by means of Microtrac UPA particle size analyzer.

As seen in Table 1, a fraction of diamond particles could be achieved in the cakes recovered from both the secondary centrifugal machine and sedimentation tank (tank 3).

TABLE 1

| Collected Cake | Particle Size (nm) | | | Ratio (%) of $D_{10}$ or $D_{90}$ to $D_{50}$ | |
|---|---|---|---|---|---|
| mass (g) | $D_{10}$ | $D_{50}$ | $D_{90}$ | $D_{10}/D_{50}$ | $D_{90}/D_{50}$ |
| Primary 170 | 35 | 56 | 107 | 63 | 191 |
| Secondary 60 | 23 | 37 | 61 | 62 | 164 |

TABLE 1-continued

| Collected Cake | Particle Size (nm) | | | Ratio (%) of $D_{10}$ or $D_{90}$ to $D_{50}$ | |
|---|---|---|---|---|---|
| mass (g) | $D_{10}$ | $D_{50}$ | $D_{90}$ | $D_{10}/D_{50}$ | $D_{90}/D_{50}$ |
| Sediment 20 | 19 | 31 | 59 | 61 | 190 |

Example 2

In this example, a centrifugal machine was used that had a performing capacity corresponding to the machines in Example 1.

The inlet (influent) side and outlet (effluent) side of the centrifugal machine were each connected with a slurry supply tank of 0.5 m³ capacity equipped with an agitator. As shown in FIG. 2, a slurry supply tank 1 was arranged upstream on the inlet side and connected to the centrifugal machine, to be used as the slurry supply tank for feeding a starting slurry to the centrifugal machine. First the sediment of diamond particles (Table 1), which had been collected in Example 1, was placed in the slurry supply tank. Then de-ionized water is added to the sediment to form 500 liters of slurry having a diamond concentration of 0.05%, with the pH adjusted by addition of ammonia water at 9.7 and a zeta potential of about −48 mV.

The centrifugal machine was operated at a 16,000 r.p.m. (with a $2.89 \times 10^4$ g acceleration), while the starting slurry was fed at a rate of 30 ml/min. to the centrifugal machine. The effluent slurry from the outlet of the centrifugal machine was received in the slurry tank 2 that was provided downstream on the outlet side of the centrifugal machine.

As the feeding and grading of whole slurry volume left the slurry tank 1 empty, while the slurry tank 2 was loaded with slurry, the slurry flow was switched to a reverse direction, so that the slurry stored in the tank 2 was run via the centrifugal machine to the tank 1, for subjecting another cycle of the grading process.

The two-way slurry flow centrifugal grading process was repeated in three cycles, and at the end about 50 grams of cake was recovered when caused sedimentation by addition of hydrochloric acid to the slurry stored in the tank.

As evaluated in terms of particle size distribution with a Microtrac UPA Particle Size Analyzer, the cake was found to contain diamond particles having a $D_{50}$ average size of 26 nm, with $D_{10}$ and $D_{90}$ sizes of 19 nm and 44 nm, respectively.

This cake was again added with and dispersed in 450 liters of de-ionized water to prepare a slurry, which then was graded further in two cycles of the centrifugal grading process that was operated with the two way slurry flow as described above. At the end of the whole processes above, the effluent slurry as collected was pH adjusted with acid so the diamond particles were condensed to cause sedimentation as a cake.

The cake was again dispersed in 450 liters of de-ionized water to form further slurry, which was then graded in two cycles of the centrifugal process with a two-way slurry flow of this Example. The diamond particles recovered from the collected effluent slurry had a $D_{50}$ average size of 17 nm, $D_{10}$ and $D_{90}$ sizes of 12 nm and 29 nm.

While the grading process of the invention has been described in reference with particular cycle numbers, that is slurry was passed to a centrifugal machine twice in example 1, and processed, in Example 2, in those three sets of two-way slurry flow grading with a machine that can correspond to six centrifugal processes, the numbers are not given for the purpose of limiting the centrifugal grading process to such numbers of cycles. Instead diamond particles carried in the effluent slurry at step 7, may be passed to the centrifugal machine to operate any number of repeated grading processes, whereby a powder may be obtained having a $D_{50}$ size under 50 nm, with the ratios of $D_{10}$ and $D_{90}$ to $D_{50}$ being over 50% and not exceeding 200% respectively.

Further, although the above examples refer as raw diamond, only to synthetic single crystalline diamond produced under static compression on a hydraulic press, natural diamond may be similarly employed since they are single crystalline, as produced by conversion from non-diamond carbon under static ultrahigh compression and exhibiting similar physical properties.

The invention claimed is:

1. A method for the production of a fine powder of single crystalline diamond particles, comprising:
   (1) impact crushing a raw material of single crystalline diamond particles that is a product of a conversion from non-diamond carbon under static ultrahigh pressure, to prepare starting minute diamond particles;
   (2) oxidizing the surfaces of said starting minute diamond particles to chemically attach hydrophilic atoms or functional groups to the surfaces of diamond particles and thus to impart thereto hydrophilic quality;
   (3) preparing a slurry by dispersing the hydrophilic diamond particles in a water medium, wherein said slurry is set and kept weakly alkaline (by addition of an alkaline substance thereto);
   (4) subjecting said slurry to a wet-mode preliminary particle size grading process, in order to remove by sedimentation from said slurry a top particle size fraction of the diamond particles, said top particle size fraction having a $D_{50}$ size of 60 nm or more;
   (5) adding, in a slurry supply tank, de-ionized water to a remainder of said slurry, which has been removed of said top particle size fraction, to a diamond concentration of 0.1% by weight or less;
   (6) subjecting said remainder of the slurry to a centrifugal grading process, whereby to separate and remove a coarser particle size fraction, in primary and secondary state, wherein the water medium is taken out of the centrifugal grading process and is received and held in an intermediate tank as a first intermediate slurry that contains a fraction of diamond particles of an average particle size that has been decreased, and whereby said coarser diamond particles are condensed as a solid mass, removed from the slurry, returned to said slurry supply tank, and dispersed in de-ionized water to form a second intermediate slurry for another cycle of said centrifugal grading, whereby fine particles in said second slurry are loosened, dispersed, and integrated into said first slurry;
   (7) repeating once or more an operation of the step (6) above with said second intermediate slurry, wherein a flow rate of the slurry into the centrifugal grading process is adjusted each time the centrifugal grading process is repeated and whereby a coarser particle size fraction of the diamond particles is separated by condensation and removed as a solid mass from the slurry, until a target set of parameters have been achieved with the diamond particles contained in said mass: a $D_{50}$ size of 50 nm or less and ratios of $D_{10}$ size to $D_{50}$ size and $D_{90}$ size to $D_{50}$ size of 50% or more and 200% or less, respectively, said slurry effluent from the centrifugal process containing a fraction of diamond particles having a smaller average particle size; and
   (8) recovering from said slurry the diamond particles as having a minimal average particle size by precipitating into a solid mass.

2. The method as claimed in claim 1, in which said hydrophilic atoms or functional groups in the step (2) comprise one selected from a-hydroxyl group, a carbonyl, and a carboxyl group.

3. A method for the production of a fine powder of single crystalline diamond particles comprising:
a preprocessing step;
a first centrifuge process step; and
a second centrifuge process step; wherein said preprocessing step comprises:
(1) a step of crushing, by an impact loading mechanical breaking device, a raw material of single crystalline diamond particles that is a product of a conversion from non-diamond carbon under static ultrahigh pressure, to prepare starting minute diamond particles,
(2) a step of oxidizing surfaces of said starting minute diamond particles to chemically attach hydrophilic atoms or functional groups to the surfaces of the diamond particles and thus to impart thereto hydrophilic quality,
(3) a step of preparing a slurry by dispersing the hydrophilic diamond particles in a water medium, wherein said slurry is set and kept weakly alkaline by addition of an alkaline substance thereto,
(4) a step of subjecting said slurry to a wet-mode preliminary particle size grading process, in order to remove by sedimentation from said slurry a top particle size fraction of the diamond particles, said top particle size fraction having a $D_{50}$ size of 60 nm or more, and
(5) a step of adding de-ionized water to a remainder of said slurry, which has been removed of said top particle size fraction, to a diamond concentration of 0.1% by weight or less,
said first centrifuge process step comprises:
(6) a step of supplying said remainder of the slurry to a centrifugal grading machine having a first centrifugal force by a first flow rate, whereby a coarser particle size fraction of the diamond particles contained in said slurry is condensed and removed from the slurry, while said water medium is taken out from the centrifugal grading machine and is supplied to a tank as a first effluent slurry that contains a fraction of diamond particles of an average particle size that has been decreased due to the removal of coarser diamond particles, and
said second centrifuge process step comprises:
(7) a step of supplying said first effluent slurry from the tank to a centrifugal grading machine having a second centrifugal force that is higher than the first centrifugal force by a second flow rate that is lower than the first flow rate, whereby the water medium is taken out from the centrifugal grading machine as a second effluent slurry that contains diamond particles having a $D_{50}$ size of 50 nm or less and ratios of $D_{10}$ size to $D_{50}$ size and $D_{90}$ size to $D_{50}$ size of 50% or more and 200% or less, separating a fraction of the diamond particles having the size other than said range by condensation, removing the separated fraction as a solid mass from the slurry, and returning the solid mass to the tank, and
wherein a further process step is provided in which the diamond particles having a minimal average particle size are removed from said second effluent slurry by precipitating in to a solid mass.

4. The method as claimed in claim 3, wherein said hydrophilic atoms or functional groups in the step (2) comprise one selected from a hydroxyl group, a carbonyl group, and a carboxyl group.

* * * * *